(12) United States Patent
Inoue et al.

(10) Patent No.: US 10,636,914 B2
(45) Date of Patent: Apr. 28, 2020

(54) CRYSTALLINE OXIDE SEMICONDUCTOR THIN FILM, METHOD FOR PRODUCING CRYSTALLINE OXIDE SEMICONDUCTOR THIN FILM, AND THIN FILM TRANSISTOR

(71) Applicant: IDEMITSU KOSAN CO., LTD., Tokyo (JP)

(72) Inventors: Kazuyoshi Inoue, Sodegaura (JP); Futoshi Utsuno, Sodegaura (JP); Yuki Tsuruma, Sodegaura (JP); Shigekazu Tomai, Sodegaura (JP); Kazuaki Ebata, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 15/748,356

(22) PCT Filed: Jul. 29, 2016

(86) PCT No.: PCT/JP2016/003528
§ 371 (c)(1),
(2) Date: Jan. 29, 2018

(87) PCT Pub. No.: WO2017/017966
PCT Pub. Date: Feb. 2, 2017

(65) Prior Publication Data
US 2018/0219098 A1 Aug. 2, 2018

(30) Foreign Application Priority Data

Jul. 30, 2015 (JP) .................................. 2015-150701

(51) Int. Cl.
*H01L 29/786* (2006.01)
*C01G 15/00* (2006.01)
(Continued)

(52) U.S. Cl.
CPC .......... *H01L 29/7869* (2013.01); *C01G 15/00* (2013.01); *C23C 14/08* (2013.01);
(Continued)

(58) Field of Classification Search
CPC .... C04B 2235/3286; C04B 2235/3296; C23C 14/086; H01L 21/02488; H01L 21/02554;
(Continued)

(56) References Cited

U.S. PATENT DOCUMENTS 8,785,927 B2 7/2014 Ebata et al.
2009/0090914 A1* 4/2009 Yano ...................... C01G 19/00
257/66

(Continued)

FOREIGN PATENT DOCUMENTS

JP 2008-163441 A 7/2008
JP 2008-163442 A 7/2008
(Continued)

OTHER PUBLICATIONS

Ebata et al, High-Mobility Thin-Film Transistors with Polycrystalline In—Ga—O channel Fabricated by DC Magnetron Sputtering, Applied Physics Express, 2011.
(Continued)

*Primary Examiner* — Eric A. Ward
(74) *Attorney, Agent, or Firm* — Foley & Lardner LLP

(57) ABSTRACT

A crystalline oxide semiconductor thin film that is composed mainly of indium oxide and comprises surface crystal grains having a single crystal orientation.

19 Claims, 2 Drawing Sheets

(51) Int. Cl.
| | |
|---|---|
| *H01L 21/02* | (2006.01) |
| *C23C 14/08* | (2006.01) |
| *C23C 14/34* | (2006.01) |
| *C23C 14/58* | (2006.01) |
| *C30B 1/02* | (2006.01) |
| *C30B 29/16* | (2006.01) |
| *H01L 29/04* | (2006.01) |
| *H01L 29/24* | (2006.01) |
| *H01L 29/66* | (2006.01) |

(52) U.S. Cl.
CPC ............ *C23C 14/086* (2013.01); *C23C 14/34* (2013.01); *C23C 14/5806* (2013.01); *C30B 1/023* (2013.01); *C30B 29/16* (2013.01); *H01L 21/02565* (2013.01); *H01L 21/02592* (2013.01); *H01L 21/02595* (2013.01); *H01L 21/02631* (2013.01); *H01L 21/02667* (2013.01); *H01L 29/04* (2013.01); *H01L 29/24* (2013.01); *H01L 29/66969* (2013.01); *C01P 2002/54* (2013.01); *C01P 2002/70* (2013.01); *C01P 2004/61* (2013.01); *C01P 2006/40* (2013.01)

(58) Field of Classification Search
CPC ......... H01L 21/02564; H01L 21/02565; H01L 21/02592; H01L 21/02595; H01L 21/02631; H01L 21/02667; H01L 21/20; H01L 21/205; H01L 21/66742; H01L 21/66969; H01L 21/7869; H01L 27/1225; H01L 29/04; H01L 29/24; H01L 29/66969; H01L 29/786; H01L 29/7869
See application file for complete search history.

(56) References Cited

U.S. PATENT DOCUMENTS

| | | |
|---|---|---|
| 2010/0108502 A1 | 5/2010 | Inoue et al. |
| 2011/0243835 A1 | 10/2011 | Inoue et al. |
| 2012/0205648 A1 | 8/2012 | Yokozeki |
| 2012/0312681 A1 | 12/2012 | Yamazaki et al. |
| 2012/0325650 A1 | 12/2012 | Yamazaki et al. |
| 2013/0011962 A1 | 1/2013 | Yamazaki et al. |
| 2013/0082218 A1 | 4/2013 | Ebata et al. |
| 2013/0108877 A1 | 5/2013 | Blomberg |
| 2013/0221351 A1* | 8/2013 | Ebata .................. H01L 29/7869 257/43 |
| 2014/0001040 A1 | 1/2014 | Inoue et al. |
| 2014/0197408 A1* | 7/2014 | Tsuruma ............. H01L 29/7869 257/43 |
| 2014/0339073 A1 | 11/2014 | Inoue et al. |
| 2017/0016108 A1 | 1/2017 | Yamazaki et al. |

FOREIGN PATENT DOCUMENTS

| | | |
|---|---|---|
| JP | 2008-214697 A | 9/2008 |
| JP | 2011-222557 A | 11/2011 |
| JP | 2011-249570 A | 12/2011 |
| JP | 2012-144410 A | 8/2012 |
| JP | 2012-169344 A | 9/2012 |
| JP | 2012-253315 A | 12/2012 |
| JP | 2013-144841 A | 7/2013 |
| JP | 2015-018959 A | 1/2015 |
| WO | WO-2010/070944 A1 | 6/2010 |

OTHER PUBLICATIONS

English Translation of the Written Opinion of the International Search Authority dated Jan. 30, 2018 in corresponding application No. PCT/JP2016/003528.
International Search Report dated Sep. 13, 2016 in corresponding application PCT/JP2016/003528.

* cited by examiner

Heading reference

Faceted

Radial

CRYSTALLINE OXIDE SEMICONDUCTOR THIN FILM, METHOD FOR PRODUCING CRYSTALLINE OXIDE SEMICONDUCTOR THIN FILM, AND THIN FILM TRANSISTOR

CROSS-REFERENCE TO RELATED APPLICATIONS

The present application is a U.S. national stage application claiming the benefit of International Patent Application No. PCT/JP2016/003528, filed Jul. 29, 2016, which claims the benefit of priority to Japanese Patent Application No. 2015-150701, filed Jul. 30, 2015, the entireties of which are hereby incorporated by reference.

TECHNICAL FIELD

The invention relates to a crystalline oxide semiconductor thin film. In particular, the invention relates to a crystalline oxide semiconductor thin film of a thin film transistor (TFT) used in a display such as a liquid crystal display or an organic EL display. The crystalline oxide semiconductor thin film of the invention can be preferably used in a solar cell, a display such as a liquid crystal element, an organic electroluminescence element and an inorganic electroluminescence element, and an electronic device such as a power semiconductor device and a touch panel. These can be preferably used in an electric device or a vehicle.

BACKGROUND ART

An amorphous oxide semiconductor used in a TFT has a higher carrier mobility as compared with a general-purpose amorphous silicon (a-Si), has a large optical band gap and can be formed into a film at lower temperatures, and hence, is expected to be applied to a next-generation display that requires an increase in size, an increase in resolution and high-speed driving or to a resin substrate having low heat resistance, etc. When forming the above-mentioned oxide semiconductor (film), a sputtering method in which a sputtering target formed of the same material as that of said film is sputtered is preferably used. The reason therefor is that, as compared with a thin film formed by ion plating method, vacuum vapor deposition method or electron beam evaporation method, a thin film formed by a sputtering method has excellent in-plane uniformity of a component composition in the film surface direction, a film thickness, etc., whereby a thin film having the same component composition as that of the sputtering target can be formed. The sputtering target is normally formed by mixing oxide powder, sintering the mixture, followed by mechanical processing.

An In—Ga—Zn—O amorphous oxide semiconductor containing In is an oxide semiconductor that has most developed as an oxide semiconductor used in a display (see Patent Documents 1 to 4, for example). Further, in recent years, in order to attain high mobility or improve reliability of a TFT, an attempt is made to use In as a main component and to change the type or concentration of added elements (see Patent Document 5, for example).

In Patent Documents 6 and 7, an In—Al-based sputtering target is reported.

In Comparative Example 6 of Patent Document 8, an oxide thin film having a composition of Al/(In+Al)=0.125 is described.

RELATED ART DOCUMENT

Patent Documents

Patent Document 1: JP-A-2008-214697
Patent Document 2: JP-A-2008-163441
Patent Document 3: JP-A-2008-163442
Patent Document 4: JP-A-2012-144410
Patent Document 5: JP-A-2011-222557
Patent Document 6: JP-A-2011-249570
Patent Document 7: WO2010/070944
Patent Document 8: WO2012/090490

SUMMARY OF INVENTION

An oxide semiconductor can be classified into an amorphous oxide semiconductor and a crystalline oxide semiconductor.

A carrier of an amorphous oxide semiconductor is formed of electrons generated by oxygen deficiency.

As for a crystalline oxide semiconductor as one of the oxide semiconductors, it is reported that a TFT having a high mobility can be obtained by forming it into a crystalline thin film. However, in a crystalline thin film, the carrier density is varied by various loads, i.e. thermal loads, oxidization loads, reduction loads, etc., imposed in each step of a TFT production. For example, when an oxide thin film is crystallized by heating at a rapid temperature-elevation speed, crystal growth occurs radially, whereby the crystal orientation becomes radial, and a large number of lattice defects causing the carrier density variation are formed in the inside of a crystal grain. Therefore, in a crystalline oxide semiconductor thin film, there is a still problem that the carrier density is varied, and hence variations in TFT characteristics cannot be suppressed.

In addition, in order to enhance the mobility and reliability of the oxide semiconductor film for a display, it is important to reduce traps existing in the energy gap of the oxide semiconductor. As one of methods for reducing traps, a method is given in which water is introduced into the chamber during sputtering to oxidize more effectively (for example, Patent Document 8). Water is decomposed in plasma, and becomes an OH radical that shows an extremely strong oxidizing power, thus exhibiting effects of reducing traps in an oxide semiconductor. However, a process of introducing water requires removal of oxygen and nitrogen dissolved in water sufficiently in advance. In addition, there is a problem that new measures have become necessary such as prevention of corrosion of a piping.

In an oxide thin film having a composition Al/(In+Al)=0.125 described Comparative Example 6 of Patent Document 8 mentioned above has a large aluminum content of 12.5 at %. By conducting film formation in the presence of water in a state where it becomes difficult to be crystallized due to the effect of amorphization of aluminum, further amorphization effects are combined, and hence, even if heating is performed at 300° C. after film formation, only fine crystals were formed. Therefore, it is thought that the problem that the carrier density varies is not solved, and variations in TFT characteristics cannot be suppressed.

An object of the invention is to provide a crystalline oxide semiconductor thin film having a stable carrier density and a thin film transistor having a high saturation mobility when this film is used as a channel layer of a thin film transistor.

Under such circumstances, the inventors formed an oxide thin film formed mainly of indium oxide without introducing impurities such as water, and heated, whereby a crystalline oxide semiconductor thin film containing surface crystal grains having a single crystal orientation was obtained. The inventors also found that, by allowing the crystal state of the oxide thin film to be in the above-mentioned state, the crystal is stabilized, whereby variations in carrier density of an oxide thin film can be suppressed, and as a result, variations in TFT characteristics can be suppressed.

Further, when the crystalline oxide semiconductor thin film contains aluminum oxide that has strong binding power with oxygen, variations in carrier density caused by various loads, i.e. thermal loads, oxidation loads, reduction loads, etc. are suppressed to obtain a more stable oxide semiconductor thin film. The invention has been attained based on this finding.

According to the invention, the following crystalline oxide semiconductor thin film, the method for producing a crystalline oxide semiconductor thin film, etc. are provided.

1. A crystalline oxide semiconductor thin film that is composed mainly of indium oxide and comprises surface crystal grains having a single crystal orientation.
2. The crystalline oxide semiconductor thin film according to 1, wherein crystal grains of which the surface crystal state is faceted is observed when an observation is made by means of an electron backscatter diffraction.
3. The crystalline oxide semiconductor thin film according to 1 or 2, wherein the area occupied by the crystal grains of which the crystal state is faceted is 50% or more.
4. The crystalline oxide semiconductor thin film according to any one of 1 to 3, which comprises one or more elements selected from the group consisting of positive trivalent metal elements other than an indium element.
5. The crystalline oxide semiconductor thin film according to 4, wherein the content of the positive trivalent metal element other than the indium element is larger than 8 at % to 17 at % or less relative to total metal contents in the crystalline oxide semiconductor thin film.
6. The crystalline oxide semiconductor thin film according to 4 or 5, wherein the positive trivalent metal element other than the indium element is one or two or more selected from the group consisting of aluminum, gallium, yttrium and a lanthanoid-based element.
7. The crystalline oxide semiconductor thin film according to any one of 1 to 6 which comprises one or more elements selected from the group consisting of positive tetravalent metal elements.
8. The crystalline oxide semiconductor thin film according to 7, wherein the content of the positive tetravalent metal element is 0.01 at % or more to 1 at % or less relative to the total metal content in the crystalline oxide semiconductor thin film.
9. The crystalline oxide semiconductor thin film according to 7 or 8, wherein the positive tetravalent metal element is one or more selected from the group consisting of tin, zirconium and cerium.
10. The crystalline oxide semiconductor thin film according to any one of 1 to 9 which has a band gap of 3.6 eV or more.
11. A method for producing the crystalline oxide semiconductor thin film according to any one of 1 to 10, comprising:
    forming an oxide thin film by sputtering by using a sputtering target composed mainly of indium oxide and by using as a sputtering gas a mixed gas of argon and oxygen that substantially comprises no impurity gas; and
    heating the obtained oxide thin film.
12. The method for producing the crystalline oxide semiconductor thin film according to 11, wherein the amount ratio of the impurity gas in the sputtering gas is 0.1 vol % or less.
13. The method for producing the crystalline oxide semiconductor thin film according to 11 or 12, wherein the sputtering target comprises one or more elements selected from the group consisting of aluminum, gallium, yttrium and a lanthanoid-based element.
14. The method for producing the crystalline oxide semiconductor thin film according to any one of 11 to 13, wherein the heating temperature is 250° C. or higher to 500° C. or lower.
15. The method for producing the crystalline oxide semiconductor thin film according to any one of 11 to 14, wherein, in the step of heating, a temperature-elevation speed is 20° C./min or less in a temperature range of from 150° C. to 250° C.
16. The method for producing the crystalline oxide semiconductor thin film according to any one of 11 to 14, wherein the heating time is 0.1 hour or longer to 5 hours or shorter.
17. A thin film transistor comprising a source electrode and a drain electrode, a gate electrode, a gate insulating film, an protective insulating film and an oxide semiconductor layer, wherein the oxide semiconductor layer is positioned between the gate insulating film and the protective insulating film and is formed of the crystalline oxide semiconductor thin film according to any one of 1 to 10.
18. The thin film transistor according to 17 that has a saturation mobility of 30 $cm^2$/V·sec or more.
19. The thin film transistor according to 17 or 18, wherein, at a drain voltage of 0.1V, from a Vg–μ curve obtained by a method for measuring a field effect mobility in a linear region, the mobility at Vg=Vth+5 is 10 $cm^2$/Vs or more and the average mobility from Vg=Vth to Vg=Vth+20 is 50% or more relative to the maximum mobility in this range.
20. An electric device or a vehicle that uses the thin film transistor according to any one of 17 to 19.

According to the invention, it is possible to provide a crystalline oxide semiconductor thin film having a stable carrier density and a thin film transistor having a high saturation mobility obtained by using the same.

MODE FOR CARRYING OUT THE INVENTION

1. Crystalline Oxide Semiconductor Thin Film

The crystalline oxide semiconductor thin film according to the invention is characterized in that it is composed mainly of indium oxide and comprises surface crystal grains having a single crystal orientation.

A crystalline thin film containing surface crystal grains having a single crystal orientation is formed of stable crystals and can suppress variations in carrier density due to various loads, i.e. thermal loads, oxidation loads, reduction loads, etc. imposed during the TFT production process. A thin film transistor using the crystalline thin film as a channel layer can achieve high saturation mobility.

Here, "composed mainly of indium oxide" means that 50 wt % or more, preferably 70 wt % or more, more preferably 80 wt % or more and further preferably 90 wt % or more of an oxide constituting a thin film is indium oxide. If the content of indium oxide is less than 50 wt % of an oxide, the saturation mobility when a thin film transistor (TFT) is formed may be lowered.

The "contains surface crystal grains having a single crystal orientation" means a state where the crystal orientation is controlled. Normally, when an observation is made by the Electron Back Scattering Diffraction (EBSD), if crystal grains in which the crystal state of the surface of the oxide semiconductor thin film is faceted state can be observed, it can be said that it "comprises surface crystal grains having a single crystal orientation".

Figure 1A:
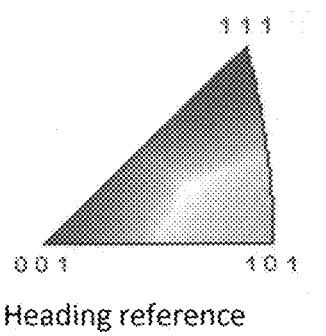
FIG. 1a is a view showing the heading reference by the Electron Back Scattering Diffraction Patterns (EBSD) as the method for analyzing the surface of an indium oxide ($In_2O_3$) thin film.
Figure 1B:
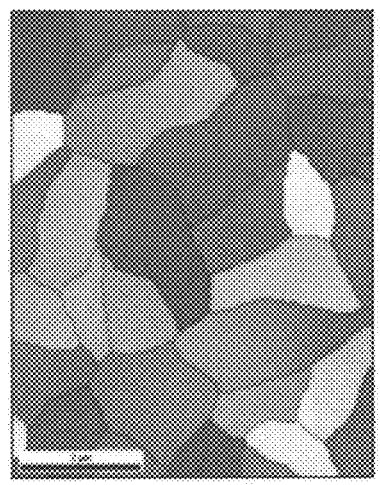
FIG. 1b is an EBSD image of the crystalline oxide semiconductor thin film obtained in Example 1, which is a typical EBSD image when the surface of indium oxide ($In_2O_3$) thin film shows a faceted crystal state.
Figure 1C:
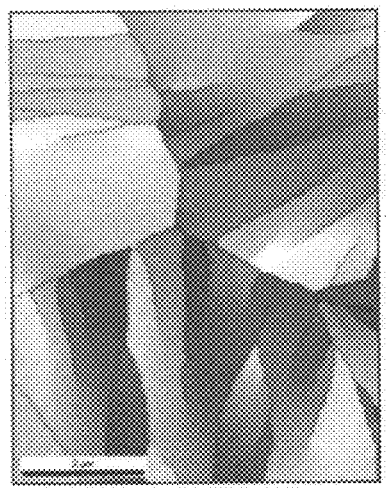
FIG. 1c is an EBSD image of the crystalline oxide semiconductor thin film obtained in Comparative Example 1, which is a typical EBSD image when the surface of indium oxide ($In_2O_3$) thin film shows a radial crystal state.

Whether a crystal is in a faceted state or in a radial state can be easily judged by an EBSD measurement. FIG. 1b shows a typical EBSD image when the surface crystal is in the faceted state. FIG. 1c shows a typical EBSD image when the surface crystal is in the radial state.

As for the faceted crystal form, the average crystal diameter is normally 0.5 μm or more, preferably 1 μm or more, more preferably 2 μm or more, and the upper value of the average grain diameter is normally 10 μm or less. Each of the crystal grains has a single crystal orientation. If the average crystal grain diameter is less than 0.5 μm, there may be a case where the crystals may become fine crystals. If the average crystal grain diameter is 10 μm or more, crystal transition may occur in the inside of the crystal, whereby the crystal state may become radial.

The grain diameter is obtained by confirming the surface morphology by EBSD and measuring the Feret's diameter (the shorter side of a rectangle that circumscribes the crystal).

The average crystal diameter is obtained by measuring the grain diameter of the faceted crystals observed in a frame with the central part of the film (Intersection of diagonals) being the center, and the average value is calculated by the arithmetic mean. The size of the frame is normally 5 μm×5 μm, but appropriately adjusted by the size of the film or the size of the grain diameter. The number of the faceted crystals in the frame is 5 or more. If the number is less than 5, an observation is conducted by enlarging the size of the frame. If the number of faceted crystals is less than 5 when an observation of the entire film is made, calculation is made by measuring the measurable crystals. In the case of the radial crystal form, as for the grain diameter, the grain diameter is normally about 1 μm to 20 μm. In particular, in the case of crystals having a diameter larger than 10 μm, the inside of such grain does not show a single crystal orientation, and has crystals of which the crystal orientation changes radially than the central part or the end part of the crystal.

The area occupied by the crystal grains having a faceted crystal state of the surface is preferably 50% or more, more preferably 80%, further preferably 90% or more. A stable carrier density can be attained if the area of the surface of the crystalline oxide semiconductor thin film occupied by the crystal grain having a faceted crystal state is 50% or more. If the number of radial crystals is increased, variations in carrier density by various loads, i.e., thermal loads, oxidation loads, reduction loads, etc. during the TFT production process may become difficult to be suppressed, the saturation mobility may become small.

As for the crystal form that is not faceted, in addition to the radial crystal form, amorphous or fine crystal grains, etc. can be given. Parts other than the area occupied by the faceted crystal grains are occupied by the grains in these forms.

The crystalline oxide semiconductor thin film according to the invention preferably contains one or more elements selected from the group consisting of positive trivalent metal elements other than an indium element. As examples of the positive trivalent metal element other than an indium element, aluminum, gallium, yttrium, a lanthanoid-based element and the like can be given. The positive trivalent metal element may preferably be any one or two or more of aluminum, gallium, yttrium and a lanthanoid-based element, and particularly preferably one or both of aluminum and a lanthanoid-based element. Further, the positive trivalent metal element is preferably any one or both of gallium and a lanthanoid-based element. As the lanthanoid-based element, lanthanum, neodymium, samarium, europium, gadolinium, terbium, dysprosium, holonium, erbium, thulium, ytterbium, lutetium are preferable, with neodymium, samarium and europium being more preferable.

The content of the trivalent metal element other than an indium element is preferably larger than 8 at % and 17 at % or less, more preferably larger than 10 at % to 15 at % or less. Here, the content of the trivalent metal element other than an indium element means the total amount of trivalent metal elements other than an indium element contained in a crystalline oxide semiconductor thin film.

Aluminum, yttrium, and a lanthanoid-based element are preferable since they have a large bonding force with oxygen, have an effect of suppressing carrier generation due to oxygen deficiency, and an effect of suppressing an increase in carrier density derived from oxygen deficiency due to various thermal loads in a TFT manufacturing process, reduction load in CVD film formation, etc.

Further, gallium is preferable since it has an effect of reducing the lattice constant of crystallized indium oxide and has an effect of improving the mobility of a TFT.

The content of aluminum and/or lanthanoid-based element is preferably larger than 8 at % to 17 at % or less, more preferably larger than 10 at % to 15 at % or less relative to all metal contents in a crystalline oxide semiconductor thin film. If the content of aluminum and/or yttrium is less than 8 at %, there may be a case that effects of suppressing an increase in carrier density at oxygen deficiency may be small and fine crystals may be generated at the time of film formation. Further, there may be a case where oxygen deficiency is generated by damage caused during film formation by CVD used for formation of an insulating film during the step. On the other hand, when the content is larger than 17 at %, there may be a case where crystallization does not occur during a crystallization step by a heat treatment or a case where only fine crystals are obtained, and no faceted crystal forms can be obtained.

When aluminum, yttrium, gallium or lanthanoid-based element is used singly, the content is preferably in the following range relative to the total metal contents in the crystalline oxide semiconductor thin film:

10 at %<Al<15 at %
8 at %<Ga<15 at %
8 at %<Y<15 at %
8 at %<lanthanoid-based element<15 at %

When two or more of aluminum, yttrium, gallium and a lanthanoid-based element are used, as mentioned above, the total content may be in a range larger than 8 at % to 17 at % or less.

A crystalline oxide semiconductor thin film containing one or more elements selected from aluminum, yttrium, gallium and a lanthanoid-based element has an optical band gap measured by an ellipsometer larger than 3.6 eV or more, and the film is less likely to malfunction due to light such as external light or light from a light emitter such as an organic EL.

The crystalline oxide semiconductor thin film according to the invention may contain one or more elements selected from the group consisting of positive tetravalent metal elements. As the positive tetravalent metal elements, tin, zirconium, cerium or the like can be given, with tin being particularly preferable.

The content of the positive tetravalent metal element is preferably 0.01 at % or more and 1.0 at % or less, more preferably 0.03 at % to 0.7 at %, and further preferably 0.05 to 0.5 at %, relative to the total metal contents in the crystalline oxide semiconductor thin film. Here, the total content of the tetravalent metal element means the total content of the tetravalent metal elements contained in the crystalline oxide semiconductor thin film.

For example, incorporation of a tin element is preferable since the resistance of a target can be lowered and stable sputtering can be conducted while reducing occurrence of abnormal discharge. By crystallizing a thin film, carriers are generated, lowering in carrier density by filling of oxygen deficiency by various loads, i.e. thermal loads, oxidation loads, etc. during the production process of a TFT, whereby lowering in carrier density can be suppressed.

The content of the tin element is preferably larger than 0.01 at % to 1.0 at % or less relative to the total metal content in the crystalline oxide semiconductor thin film. If the content of a tin element is 0.01 at % or less, ability of carrier generation along with crystallization may be small, and the amount of carrier may be decreased due to heat load and oxidation load during oxidation process, whereby mobility may be lowered. Further, a tin element also contributes to the stability of a target during film formation. If the content exceeds 1.0 at %, ability of carrier generation is too strong, and as a result, the amount of carriers becomes too large, or a tin element becomes the scattering center of the carrier, whereby mobility becomes small. The content of tin is more preferably 0.03 at % to 0.7 at %, and further preferably 0.05 to 0.5 at %.

The crystalline oxide semiconductor thin film according to the invention is advantageously used for a thin film transistor (TFT) used in a display such as a liquid crystal display or an organic EL display.

2. Method for Producing Crystalline Oxide Semiconductor Thin Film

The method for producing the crystalline oxide semiconductor thin film according to the invention comprises: forming an oxide thin film by sputtering by using a sputtering target composed mainly of indium oxide and by using as a sputtering gas a mixed gas of argon and oxygen that substantially comprises no impurity gas; and heating the obtained oxide thin film.

A thin film obtained by using a sputtering target composed mainly of indium oxide, and using a mixed gas of high-purity argon and high-purity oxygen that substantially comprises no impurities as a sputtering gas is an amorphous oxide thin film. By allowing the film to be crystallized by heating, a crystalline oxide semiconductor thin film in which surface crystals have uniform crystal orientation, preferably faceted crystalline state, is obtained.

The sputtering gas "substantially comprises no impurities" means that a gas of impurities other than argon and oxygen is not actively incorporated except for incorporation of adsorption water accompanied by insertion of glass or except for a leaked gas from a chamber (inevitably mixed in impurities gas). For example, a mixed gas of high-purity argon and high-purity oxygen that is commercially available can be used. Impurities should be eliminated, if possible.

The amount ratio of an impurity gas in a sputtering gas is preferably 0.1 vol % or less, with 0.05 vol % or less being more preferable. If the amount of an impurity gas is large, there may be a case where crystallization of a thin film is inhibited, whereby a thin film is not crystallized or there may be a case where only fine crystals are formed, and desired faceted crystals cannot be obtained. The purity of high-purity argon or high-purity oxygen is preferably 99% or more, more preferably 99.9% or more, and further preferably 99.99% or more.

The oxygen partial pressure in a mixed gas of argon and oxygen as a sputtering gas is preferably in a range of 5 to 50 vol %, more preferably 10 to 30 vol %. If the oxygen partial pressure is within the above-mentioned range, the film is easily crystallized and becomes a semiconductor at the time of heating. The degree of oxidation, i.e. the degree of crystallization, can be adjusted by changing oxygen partial pressure. The oxygen partial pressure may be appropriately selected according to need.

Further, it is preferable that the sputtering target used that contains indium oxide as a main component contain one or more elements selected from aluminum, yttrium, gallium and a lanthanoid-based element. The ionic radius of an aluminum atom is 0.53 Å, the ionic radius of a gallium atom is 0.62 Å, the ionic radius of an yttrium atom is 0.89 Å, the atomic radius of a lanthanoid-based element (e.g. samarium atom) is 0.96 Å, which is different from the ionic radius of an In atom of 0.80 Å, and hence crystallization is inhibited at the time of forming a thin film. Since a sputtering target contains an aluminum element, an yttrium element, a lanthanoid-based element such as a samarium element, an amorphous oxide thin film can be obtained without fail without the need of introduction of impurities such as water. If fine crystals are formed at the time of forming a thin film, faceted crystals may not be formed after heating. In this case, by scattering of carriers by fine crystals, scattering of carriers in the grain boundary, etc. mobility may be lowered. For this reason, it is desired that the amorphous state be kept at the time of film formation.

In addition, it is desired that a sputtering target composed mainly of indium oxide contain a gallium element. Gallium can be dissolved in a solid state in indium oxide, and can reduce the lattice constant of indium oxide. As a result, it is thought that mobility of a TFT as a final product is improved. On the other hand, if a large amount of a gallium element is contained, it tends to be amorphized without being crystallized. The reason therefor is thought that a gallium element having a small ionic radius cannot be dissolved in a solid state in indium oxide. In such a case, by allowing an element having a large ionic radius (e.g. yttrium element, lanthanoid-based element such as a samarium element) to co-exist, strain of crystals generated by incorporation of a gallium ion can be eliminated, whereby stable indium oxide crystals can be obtained, and stable TFT properties can be exhibited.

The heating temperature for crystallizing the amorphous thin film is preferably in the range of 250° C. to 500° C., more preferably 280° C. to 470° C. and further preferably 300° C. to 450° C. If the heating temperature is lower than 250° C., there may be a case where an oxide thin film is not crystallized and, even if it is crystallized, there may be a case where the crystal state does not become faceted, and become fine grains. If the temperature exceeds 500° C., there may be a case that the heat resistance is not sufficient, or the cost incurred for a heating device becomes too expensive.

The heating time for crystallizing the amorphous thin film is preferably 0.1 hour or longer and 5 hours or shorter, more preferably 0.3 hour or longer and 3 hours or shorter, and further preferably 0.5 hour or longer and 2 hours or shorter. If the heating time is shorter than 0.1 hour, the heating time is too short. There may be a case where the thin film is not crystallized or becomes a radial crystal, not faceted. A heating time of 5 hours or longer is not realistic since an excessively large cost is incurred for heating. The "heating time" means a time from the prescribed heating temperature to a time when the temperature starts to drop.

In order to allow faceted crystals to be generated easily, it is preferable to allow the speed of crystallization to be slower than the speed of oxygen diffusion. If the concentration of oxygen in the oxide thin film after film formation is high, insufficiency in the amount of oxygen does not occur at the time of crystallization, and as a result, faceted crystals are obtained even if crystallization is conducted at a high crystallization speed. However, if the speed of crystallization is increased in a state where the amount of oxygen is insufficient, oxygen deficiency occurs at the time of crystallization, and with this oxygen deficiency being as a starting point, crystal transition occurs and radial crystals, not faceted crystals, tend to be generated.

In order to obtain faceted crystals stably in a state that the amount of oxygen in the oxide thin film after film formation is insufficient, it is preferable to allow the crystallization speed to be slower than the oxygen diffusion speed. That is, it is preferable to allow the temperature-elevation speed between 150° C. to 250° C. for which the crystallization starts, to be 20° C./min or less, more preferably 15° C./min or less, with 10° C./min or less being further preferable. With this temperature-elevation speed, the crystallization speed can be slower than the oxygen diffusion speed without fail, faceted crystals can be obtained easily. If heating is conducted at a temperature-elevation speed of higher than 20° C./min, there may be a case where the crystal form may be radial, not faceted, whereby suppression in variation in carrier density by various loads, i.e. thermal loads, oxidization loads, reduction loads, etc. during the TFT production process may be difficult, or the saturation mobility when the film is formed in to a TFT may be small.

As for the lower limit of the temperature-elevation speed, if the temperature-elevation speed is slow than 1° C./min, the temperature-elevation speed becomes too slow, the heating time is prolonged, and the heating cost incurs, and hence the temperature-elevation speed is preferably 2° C./min or higher, more preferably 3° C./min or higher.

It is preferable not to put in a substrate directly into a furnace having a temperature of 250° C. or higher, but to put in a substrate into a furnace having a temperature of 150° C. or lower, and then to elevate the temperature at the above-mentioned preferable temperature-elevation speed to 250° C. By allowing the temperature-elevation speed between 150° C. to 250° C. to be in the above-mentioned range, more preferable faceted crystal form can be obtained.

3. Thin Film Transistor and Electronic Device

The thin film transistor (TFT) according to the invention comprises a source electrode and a drain electrode, a gate electrode, a gate insulating film, an protective insulating film and an oxide semiconductor layer, wherein the oxide semiconductor layer is positioned between the gate insulating film and the protective insulating film and is formed of the crystalline oxide semiconductor thin film according to the invention.

The crystalline oxide semiconductor thin film according to the invention and the crystalline oxide semiconductor thin film manufactured by the method for manufacturing a crystalline oxide semiconductor thin film according to the present invention includes surface crystal grains having a single crystal orientation. Preferably, when observed by EBSD, crystal grains of which the surface state are in a faceted state are observed. The obtained crystalline oxide semiconductor thin film is a stable oxide semiconductor thin film in which variations in carrier concentration by various loads, i.e. thermal loads, oxidization loads, reduction loads, etc. during the production process of a TFT can be suppressed. By using this film in a channel layer, a TFT having a saturation mobility of preferably 30 cm$^2$/V·sec or more, more preferably 50 cm$^2$/V·sec or more, and further preferably 70 cm$^2$/V·sec or more can be obtained.

In the crystalline oxide semiconductor thin film and the crystalline oxide semiconductor film produced by the method for producing a crystalline oxide semiconductor thin film, an ohmic electrode made of an indium metal, ITO, IZO, etc. is arranged on one side, and a Schottky electrode made of a metal such as molybdenum and titanium, carbides, silicide, etc. is arranged on the other side, whereby a Schottky barrier diode can be configured.

The TFT according to the invention is preferably a high-speed response TFT. As for properties for evaluating whether it is a high-speed TFT or not will be explained in the Examples given later.

The TFT according to the invention can be preferably used in a solar battery, a display such as a liquid crystal, an organic electroluminescence device or an inorganic electroluminescence, an electronic device such as a power semiconductor device and a touch panel. These can preferably be used in electric devices or vehicles.

EXAMPLES

Example 1

Figure 2:
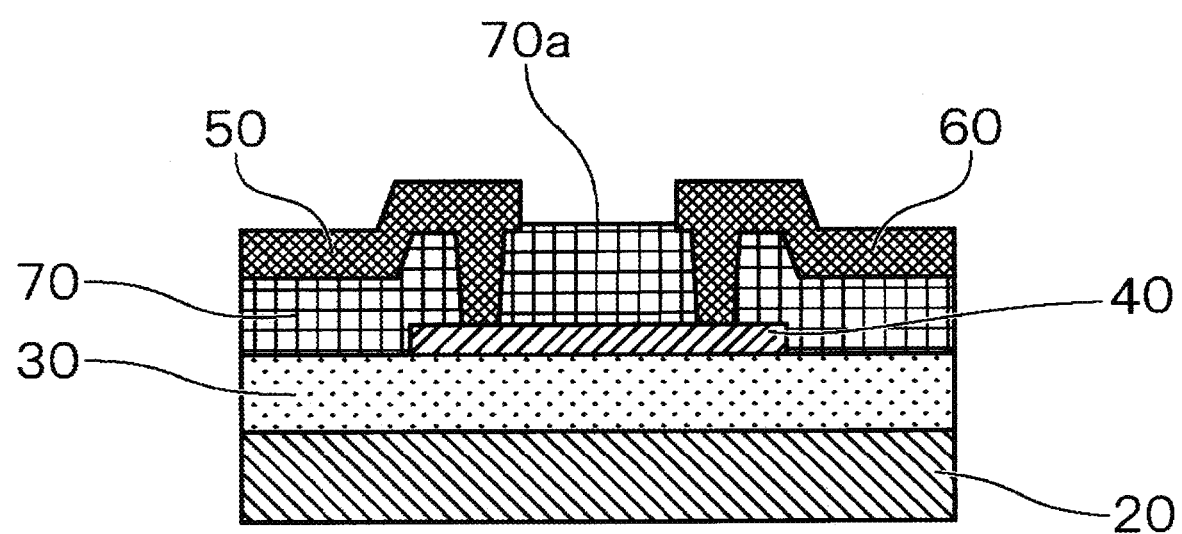
FIG. 2 is a schematic cross-sectional view showing the structure of a bottom-gate type thin film transistor according to one embodiment of the invention produced in the Examples and the Comparative Examples.

The thin film transistor having a structure shown in FIG. 2 was produced by the following steps:
(1) Film-Forming Step By sputtering using a sputtering target obtained by mixing 96 wt % (89.8 at %) of indium oxide and 4 wt % (10.2 at %) of aluminum oxide, on a silicon wafer (gate electrode 20) with a thermally oxidized film (gate insulating film 30), a 50 nm-thick thin film (oxide semiconductor layer 40) was formed through a metal mask. As the sputtering gas, a mixed gas of high-purity argon and high-purity oxygen (concentration of impurities: 0.01 vol %) was used, and sputtering was conducted under the film-forming conditions shown in Table 1-1.

(2) Heating Step

The obtained stacked body was subjected to a heat treatment in the air at the temperature, the time and the conditions shown in Table 1-1. The "heat treatment after film formation: time (min)" in the "heat treatment conditions after the formation of the semiconductor film" in Table 1-1 means the time taken from the time at which the temperature reaches the heat-treatment temperature to the time at which the temperature starts to drop.

(3) Formation of Protective Insulating Film

On the semiconductor thin film after heating, by the chemical deposition method (CVD) with a substrate temperature being 350° C., an $SiO_2$ film (protective insulating film; interlayer insulating film 70, channel part interlayer insulating film 70a (at this time, a continuous film with no contact holes) was formed, and a heat treatment was conducted under conditions shown in Table 1-1.

(4) Formation of Source and Drain Electrodes

On the $SiO_2$ film after the heat treatment, a contact hole was formed. By using a metal mask, a molybdenum metal was attached by sputtering as the source and drain electrodes 50 and 60, whereby a thin film transistor (TFT) was completed. Then, the properties of the TFT were evaluated.

A sample on which only an oxide thin film was placed on a glass substrate was simultaneously formed into a film, and a hall measurement was conducted in each stage shown in Table 1-1, whereby an increase and decrease in carrier density was measured.

<Evaluation of Thin Film Properties of Semiconductor Film>

Hall Effect Measurement

In the same manner as in the TFT production process, a 50 nm-oxide semiconductor film was formed on a glass substrate, followed by a heat treatment. Then, the film was cut into a 1 cm×1 cm square. At the four corners, gold (Au) was deposited by means of an ion coater by using a metal mask in a size of 2 mm×2 mm or less.

As the glass substrate, ABC-G manufactured by Nippon Electric Glass Co., Ltd. was used.

The sample for measuring hall effect was set in a hall effect specific resistance measurement apparatus (ResiTest 8300, manufactured by Toyo Corporation), the hall effect was evaluated at room temperature, whereby the carrier density and the mobility were obtained. The results are shown in Table 1-1.

On the semiconductor film for measuring the hall effect, a $SiO_2$ film was formed by a CVD apparatus, hall measurement was conducted. After the heat treatment, hall measurement was conducted. The results are shown in Table 1-1.

Crystal Properties of Semiconductor Film

The crystalline property of the unheated film and the heated film after the sputtering (after film deposition) was evaluated by an X-ray diffraction (XRD) measurement, it was revealed that the film was amorphous before the heating and the film was crystalline (bixbyite structure) after the heating. The lattice constant of the bixbyite structure may be changed by the solid solution substitution of the metal atoms added. If the crystal structure other than the bixbyite structure was deposited as the main component, the mobility may be lowered.

As for the film after the heating, the surface morphology was confirmed by EBSD to measure the feret diameter. As a result, crystal grains having an average grain size of 2 μm or larger and having a faceted crystal state were confirmed. The average crystal grain size was 2 μm or larger. The average crystal grain diameter was obtained by measuring the grain diameter of the faceted crystals in a 5 μm×5 μm frame and calculating the arithmetic mean value of these grain diameters. The ratio of the faceted crystals on the surface of the oxide thin film was larger than 95%, and the grains other than the faceted crystals were grains in the radial crystal state or fine grains present on the crystal boundary. The results are shown in Table 1-1. As for the ratio of the faceted crystals occupying the surface of the oxide thin film, from a film surface image obtained by EBSD, crystal grains shown in monotone were judged to be faceted crystals, and the area of the faceted crystals in the film surface image obtained by EBSD was obtained.

The EBSD image of the crystalline oxide semiconductor thin film obtained in Example 1 is shown in FIG. 1b.

Bandgap of Semiconductor Film

A film was formed on a quarts substrate, and the film was subjected to a heat treatment as in the case of a semiconductor film. The transmittance spectrum of the thin film sample was measured. The wavelength on the horizontal axis was converted into an energy (eV) and the transmittance on the vertical axis was converted into $(\alpha h v)^2$ wherein a is an absorption coefficient, h is a plank constant and v is a vibration. Fitting was conducted for a position at which absorption was risen, and an eV value at a point at which it crossed the baseline was calculated.

<Evaluation of Properties of TFT>

Evaluation was conducted for the following properties of the obtained TFT. The results are shown in Table 1-1.

The saturation mobility was obtained from the transfer characteristics when 5V of drain voltage was applied. Specifically, a graph of the transfer characteristics Id–Vg was prepared, the transconductance (Gm) of each Vg was calculated, and the saturation mobility was derived from the formula of the linear region. Gm is expressed by $\partial(Id)/\partial(Vg)$, Vg of from −15 to 25 V was applied, and the maximum mobility in that range was defined as saturation mobility. In the invention, unless otherwise indicated, the saturation mobility was evaluated by this method. The Id mentioned above was current flown between the source electrode and the drain electrode, and Vg is a gate voltage when a voltage Vd was applied between the source electrode and the drain electrode.

The threshold voltage (Vth) was defined as Vg at $Id=10^{-9}$ A from the graph of transfer characteristics.

As for the on-off ratio, the ratio [On/Off] was determined with Id value of Vg=−10 V as the Off current value and Id value of Vg=20 V as the On current value.

<Evaluation of High-Speed Response TFT>

It is desired that the field effect mobility in the linear region be obtained from transmission properties when 0.1 V of drain voltage was applied. Specifically, a graph of the transfer characteristics Id-Vg is prepared, the transconductance (Gm) of each Vg is calculated, and the field effect mobility is derived by the equation of the linear region. In the meantime, Gm is expressed by $\partial(Id)/\partial(Vg)$, and as for Vg, a voltage of −15 to 20 V is applied, and unless otherwise indicated, the maximum mobility in this region is defined as the field effect mobility. Although it is possible to discuss the properties of the mobility in the saturation region, the formula in the saturation region is established generally in the case of Vg<Vd. It is required to apply a sufficiently large Vd to measure the dependency of Vg, and it may affect the destruction, etc. of a device. Therefore, in order to discuss the mobility at a low gate voltage, it is desirable to discuss with respect to the mobility in a linear region (Vg>Vd) when Vd is small. The field effect mobility in the linear region was evaluated by this method. The Id is current flown between a source electrode and a drain electrode, and Vg is a gate voltage when a voltage Vd is applied between the source electrode and the drain electrode.

As mentioned above, from the Vg–μ curve obtained by the method for measuring a field effect mobility in the linear region, a TFT in which the mobility at Vg=Vth+5 is 10 cm$^2$/Vs or more and the average mobility in a range from Vg=Vth to Vg=Vth+20 is 50% or more of the maximum mobility in this range is taken as a high-response field effect transistor.

Here, the average mobility can be obtained from a Vg–μ graph by the following formula:

$$\text{Average mobility} = \int_{Vth}^{Vth+20} \mu \, dVg/20$$

As mentioned above, since the mobility at Vg=Vth+5 is 10 cm$^2$/Vs or more, a sufficient mobility is obtained when a gate voltage applied is low. In particular, when used in combination with a silicon semiconductor, if a source and drain voltage of a silicon semiconductor is low, this voltage acts as the gate voltage of an oxide semiconductor. Therefore, a high mobility at a low gate voltage is important. Since the average mobility from Vg=Vth to Vg=Vth+20 occupies 50% or more of the maximum mobility in this range, injection of holes to a capacitor, etc. that retains a voltage can be conducted at a high speed.

Examples 2 to 9 and Comparative Examples 1 and 2

Thin film transistors were produced in the same manner as in Example 1, except that semiconductor thin films were formed by using sputtering targets having the compositions shown in Tables 1-1 to 1-3, and a heat treatment or the like was conducted. The properties of a TFT were evaluated.

An EBSD image of the crystalline oxide semiconductor thin film obtained in Comparative Example 1 is shown in FIG. 1c.

In the same manner as in Example 1, for the sample in which only the oxide thin film was mounted on the glass substrate, hall measurement was conducted at each stage shown in Tables 1-1 to 1-3, and as a result, an increase or decrease in carrier density and band gap were measured. The results are shown in Tables 1-1 to 1-3.

In the atomic ratio of the sputtering targets in the table, the numerical value shown by "wt %" indicates the weight ratio (charged amount) of indium oxide, aluminum oxide, yttrium oxide, tin oxide, and the numerical value shown by "at %" indicates the atomic ratio of an indium element, an aluminum element, an yttrium element and a tin element.

The "E+XX" in the table means "1×10$^{+XX}$".

The "ratio % of the average mobility relative to the maximum mobility in the table means the ratio (%) of the average mobility in this range relative to the maximum mobility in the range of from Vg=Vth to Vg=Vth+20.

TABLE 1-1

| | | Ex. 1 | Ex. 2 | Ex. 3 | Ex. 4 |
|---|---|---|---|---|---|
| Atomic ratio of sputtering target | In/(In + Al + Y + Sn): wt % (at %) | 96.0 wt % (89.8 at %) | 95.0 wt % (87.5 at %) | 94.0 wt % (85.2 at %) | 93.0 wt % (83.0 at %) |
| | Al/(In + Al + Y + Sn): wt % (at %) | 4.0 wt % (10.2 at %) | 5.0 wt % (12.5 at %) | 6.0 wt % (14.8 at %) | 7.0 wt % (17.0 at %) |
| | Y/(In + Al + Y + Sn): wt % (at %) | 0.0 wt % (0.0 at %) | 0.0 wt % (0.0 at %) | 0.0 wt % (0.0 at %) | 0.0 wt % (0.0 at %) |
| | Sn/(In + Al + Y + Sn): wt % (at %) | 0.0 wt % (0.0 at %) | 0.0 wt % (0.0 at %) | 0.0 wt % (0.0 at %) | 0.0 wt % (0.0 at %) |
| Film forming conditions of semiconductor film | Atmospheric gas | Ar + $O_2$ | Ar + $O_2$ | Ar + $O_2$ | Ar + $O_2$ |
| | Back pressure before film formation (Pa) | 5.E−04 | 5.E−04 | 5.E−04 | 5.E−04 |
| | Sputtering pressure (Pa) at the time of film formation | 0.5 | 0.5 | 0.5 | 0.5 |
| | Substrate temperature at the time of film formation (° C.) | Room temperature | Room temperature | Room temperature | Room temperature |
| | Oxygen partial pressure at the time of film formation (%) | 10 | 10 | 10 | 10 |
| | Water partial pressure at the time of film formation (%) | — | — | — | — |
| | Hydrogen partial pressure at the time of film formation (%) | — | — | — | — |
| Heat treatment conditions after forming semiconductor film | Heat treatment after film formation: Temperature (° C.) | 300 | 300 | 300 | 350 |
| | : Temperature elevation speed (° C./min) | 15 | 15 | 15 | 15 |
| | : Time(min) | 60 | 60 | 60 | 60 |
| | : Atmosphere | Air | Air | Air | Air |
| Thin film properties of semiconductor film | Film thickness (nm) | 50 | 50 | 50 | 50 |
| | Hall measurement carrier density (cm$^{-3}$) | 6.7E+16 | 3.4E+15 | 4.2E+16 | 5.7E+17 |
| | Hall measurement mobility (cm$^2$/V · sec) | 14.3 | 11.6 | 1.57 | 10.0 |
| | Crystallinity immediately after deposition (XRD) | Amorphous | Amorphous | Amorphous | Amorphous |
| | Crystallinity immediately after heating (XRD) | Crystalline: Bixbyite structure | Crystalline: Bixbyite structure | Crystalline: Bixbyite structure | Crystal: Bixbyite structure |
| | Average crystal grain size (grain size: μm) | Facet | Facet | Facet | Facet |
| | | 2 μm or more | 2 μm or more | 2 μm or more | 2 μm or more |
| | Ratio of area occupied by faceted crystals (%) immediately after heating by crystallinity (EBSD) | >95% | >90% | >85% | >75% |
| | Band gap (eV) of thin film | 3.6 | 3.7 | 3.7 | 3.6 |
| Properties of semiconductor layer after formation of $SiO_2$ film by CVD at a substrate temperature of 350° C. | Hall measurement carrier density (cm$^{-3}$) | 5.9E+18 | 8.0E+18 | 5.4E+18 | 6.2E+19 |
| | Hall measurement mobility (cm$^2$/V · sec) | 9.7 | 4.4 | 5.9 | 13.9 |
| Properties after heat treatment after formation of $SiO_2$ film by CVD | Heat treatment: Temperature (° C.) | 300 | 300 | 300 | 300 |
| | : Time (min) | 60 | 60 | 60 | 60 |
| | : Atmosphere | Air | Air | Air | Air |
| | Hall measurement carrier density (cm$^{-3}$) | 4.0E+16 | 5.8E+17 | 7.7E+17 | 1.8E+17 |
| | Hall measurement mobility (cm$^2$/V · sec) | 7.3 | 1.4 | 2.1 | 13.9 |
| TFT properties | Saturation mobility (cm$^2$/V · sec) | 87.4 | 91.5 | 76.5 | 51.6 |
| | Vth(V) | −0.5 | −0.7 | −0.04 | −0.7 |
| | On/off ratio | >E+8 | >E+8 | >E+7 | >E+7 |
| | Off current(A) | <E−12 | <E−12 | <E−12 | <E−12 |
| High-speed response TFT properties | Mobility at Vth + 5 V in linear region (cm$^2$/V · sec) | 23.5 | 30.5 | 22.5 | 15.2 |
| | Average mobility ratio relative to maximum mobility (%) | 57 | 68 | 71 | 58 |

TABLE 1-2

| | | Ex. 5 | Ex. 6 |
|---|---|---|---|
| Atomic ratio of sputtering target | In/(In + Al + Y + Sn): wt % (at %) | 95.9 wt % (89.72 at %) | 94.7 wt % (87.21 at %) |
| | Al/(In + Al + Y + Sn): wt % (at %) | 4.0 wt % (10.19 at %) | 5.0 wt % (12.54 at %) |
| | Y/(In + Al + Y + Sn): wt % (at %) | 0.0 wt % (0.0 at %) | 0.0 wt % (0.0 at %) |
| | Sn/(In + Al + Y + Sn): wt % (at %) | 0.1 wt % (0.09 at %) | 0.3 wt % (0.25 at %) |
| Film forming conditions of semiconductor film | Atmospheric gas | Ar + $O_2$ | Ar + $O_2$ |
| | Back pressure before film formation (Pa) | 5.E−04 | 5.E−04 |
| | Sputtering pressrue (Pa) at the time of film formation | 0.5 | 0.5 |
| | Substrate temperature at the time of film formation (° C.) | Room temperature | Room temperature |
| | Oxygen partial pressure at the time of film formation (%) | 10 | 10 |
| | Water partial pressure at the time of film formation (%) | — | — |
| | Hydrogen partial pressure at the time of fim formation (%) | — | — |
| Heat treatment conditions after forming semiconductor film | Heat treatment after film formation: Temperature (° C.) | 300 | 300 |
| | : Temperature elevation speed (° C./min) | 15 | 5 |
| | : Time (min) | 60 | 60 |
| | : Atmosphere | Air | Air |
| Thin film properties of semiconductor film | Film thickness (nm) | 50 | 50 |
| | Hall measurement carrier density ($cm^{-3}$) | 8.1E+16 | 5.9E+17 |
| | Hall measurement mobility ($cm^2/V \cdot sec$) | 7.4 | 12.0 |
| | Crystallinity immediately after deposition (XRD) | Amorphous | Amorphous |
| | Crystallinity immediately after heating (XRD) | Crystalline: Bixbyite structure | Crystalline: Bixbyite structure |
| | Average crystal grain size (grain size: μm) immediately after heating by crystallinity (EBSD) | Facet 2 μm or more | Facet 2 μm or more |
| | Ratio of area occupied by faceted crystals (%) | >80% | >80% |
| | Band gap (eV) of thin film | 3.7 | 3.7 |
| Properties of semiconductor layer after formation of $SiO_2$ film by CVD at a substrate temperature of 350° C. | Hall measuremnt carrier density ($cm^{-3}$) | 5.9E+18 | 1.7E+19 |
| | Hall measuremnt mobility ($cm^2/V \cdot sec$) | 8.5 | 5.9 |
| Properties after heat treatment after formation of $SiO_2$ film by CVD | Heat treatment: Temperature (° C.) | 300 | 300 |
| | : Time (min) | 60 | 60 |
| | : Atmosphere | Air | Air |
| | Hall measurement carrier density ($cm^{-3}$) | 3.6E+16 | 1.8E+17 |
| | Hall measurement mobility ($cm^2/V \cdot sec$) | 6.6 | 9.5 |
| TFT properties | Saturation mobility ($cm^2/V \cdot sec$) | 65.8 | 93.1 |
| | Vth(V) | −0.13 | −0.55 |
| | On/off ratio | >E+7 | >E+7 |
| | Off current (A) | <E−12 | <E−12 |
| High-speed response TFT properties | Mobility at Vth + 5 V in linear region ($cm^2/V \cdot sec$) | 18.8 | 25.2 |
| | Average mobility ratio relative to maximum mobility (%) | 55 | 59 |

| | | Ex. 7 | Ex. 8 |
|---|---|---|---|
| Atomic ratio of sputtering target | In/(In + Al + Y + Sn): wt % (at %) | 94.5 wt % (87.04 at %) | 89.5 wt % (87.53 at %) |
| | Al/(In + Al + Y + Sn): wt % (at %) | 5.0 wt % (12.54 at %) | 0.0 wt % (0.0 at %) |
| | Y/(In + Al + Y + Sn): wt % (at %) | 0.0 wt % (0.0 at %) | 10.0 wt % (12.02 at %) |
| | Sn/(In + Al + Y + Sn): wt % (at %) | 0.5 wt % (0.42 at %) | 0.5 wt % (0.45 at %) |
| Film forming conditions of semiconductor film | Atmospheric gas | Ar + $O_2$ | Ar + $O_2$ |
| | Back pressure before film formation (Pa) | 5.E−04 | 5.E−04 |
| | Sputtering pressrue (Pa) at the time of film formation | 0.5 | 0.5 |
| | Substrate temperature at the time of film formation (° C.) | Room temperature | Room temperature |
| | Oxygen partial pressure at the time of film formation (%) | 10 | 10 |
| | Water partial pressure at the time of film formation (%) | — | — |
| | Hydrogen partial pressure at the time of fim formation (%) | — | — |
| Heat treatment conditions after forming semiconductor film | Heat treatment after film formation: Temperature (° C.) | 300 | 350 |
| | : Temperature elevation speed (° C./min) | 15 | 15 |
| | : Time (min) | 60 | 60 |
| | : Atmosphere | Air | Air |
| Thin film properties of semiconductor film | Film thickness (nm) | 50 | 50 |
| | Hall measurement carrier density ($cm^{-3}$) | 4.4E+17 | 2.8E+15 |
| | Hall measurement mobility ($cm^2/V \cdot sec$) | 2.2 | 4.2 |
| | Crystallinity immediately after deposition (XRD) | Amorphous | Amorphous |
| | Crystallinity immediately after heating (XRD) | Crystalline: Bixbyite structure | Crystalline: Bixbyite structure |
| | Average crystal grain size (grain size: μm) immediately after heating by crystallinity (EBSD) | Facet 2 μm or more | Facet 2 μm or more |
| | Ratio of area occupied by faceted crystals (%) | >80% | >80% |
| | Band gap (eV) of thin film | 3.7 | 3.7 |
| Properties of semiconductor layer after formation of $SiO_2$ film by CVD at a substrate temperature of 350° C. | Hall measuremnt carrier density ($cm^{-3}$) | 5.0E+19 | 9.6E+17 |
| | Hall measuremnt mobility ($cm^2/V \cdot sec$) | 5.9 | 4.8 |
| Properties after heat treatment after formation of $SiO_2$ film by CVD | Heat treatment: Temperature (° C.) | 300 | 350 |
| | : Time (min) | 60 | 60 |
| | : Atmosphere | Air | Air |
| | Hall measurement carrier density ($cm^{-3}$) | 7.7E+17 | 1.0E+17 |
| | Hall measurement mobility ($cm^2/V \cdot sec$) | 2.14 | 5.7 |

TABLE 1-2-continued

| | | | |
|---|---|---|---|
| TFT properties | Saturation mobility (cm²/V · sec) | 91.5 | 75.8 |
| | Vth(V) | −0.7 | 3.3 |
| | On/off ratio | >E+7 | >E+8 |
| | Off current (A) | <E−12 | <E−12 |
| High-speed response TFT properties | Mobility at Vth + 5 V in linear region (cm²/V · sec) | 23.5 | 16.5 |
| | Average mobility ratio relative to maximum mobility (%) | 54 | 56 |

| | | Ex. 9 |
|---|---|---|
| Atomic ratio of sputtering target | In/(In + Al + Y + Sn): wt % (at %) | 91.5 wt % (84.90 at %) |
| | Al/(In + Al + Y + Sn): wt % (at %) | 4.0 wt % (10.11 at %) |
| | Y/(In + Al + Y + Sn): wt % (at %) | 4.0 wt % (4.56 at %) |
| | Sn/(In + Al + Y + Sn): wt % (at %) | 0.5 wt % (0.43 at %) |
| Film forming conditions of semiconductor film | Atmospheric gas | Ar + O$_2$ |
| | Back pressure before film formation (Pa) | 5.E−04 |
| | Sputtering pressrue (Pa) at the time of film formation | 0.5 |
| | Substrate temperature at the time of film formation (° C.) | Room temperature |
| | Oxygen partial pressure at the time of film formation (%) | 10 |
| | Water partial pressure at the time of film formation (%) | — |
| | Hydrogen partial pressure at the time of fim formation (%) | — |
| Heat treatment conditions after forming semiconductor film | Heat treatment after film formation: Temperature (° C.) | 400 |
| | : Temperature elevation speed (° C./min) | 15 |
| | : Time (min) | 60 |
| | : Atmosphere | Air |
| Thin film properties of semiconductor film | Film thickness (nm) | 50 |
| | Hall measurement carrier density (cm⁻³) | 2.7E+15 |
| | Hall measurement mobility (cm²/V · sec) | 7.8 |
| | Crystallinity immediately after deposition (XRD) | Amorphous |
| | Crystallinity immediately after heating (XRD) | Crystalline: Bixbyite structure |
| | Average crystal grain size (grain size: μm) immediately after heating by crystallinity (EBSD) | Facet 2 μm or more |
| | Ratio of area occupied by faceted crystals (%) | >90% |
| | Band gap (eV) of thin film | 3.65 |
| Properties of semiconductor layer after formation of SiO$_2$ film by CVD at a substrate temperature of 350° C. | Hall measuremnt carrier density (cm⁻³) | 3.8E+18 |
| | Hall measuremnt mobility (cm²/V · sec) | 6.7 |
| Properties after heat treatment after formation of SiO$_2$ film by CVD | Heat treatment: Temperature (° C.) | 350 |
| | : Time (min) | 60 |
| | : Atmosphere | Air |
| | Hall measurement carrier density (cm⁻³) | 7.3E+16 |
| | Hall measurement mobility (cm²/V · sec) | 7.8 |
| TFT properties | Saturation mobility (cm²/V · sec) | 74.2 |
| | Vth(V) | 5.9 |
| | On/off ratio | >E+7 |
| | Off current (A) | <E−13 |
| High-speed response TFT properties | Mobility at Vth + 5 V in linear region (cm²/V · sec) | 14.8 |
| | Average mobility ratio relative to maximum mobility (%) | 51 |

TABLE 1-3

| | | Comp. Ex. 1 | Comp. Ex. 2 |
|---|---|---|---|
| Atomic ratio of sputtering target | In/(In + Al + Y + Sn): wt % (at %) | 98.0 wt % (94.7 at %) | 92.0 wt % (80.9 at %) |
| | Al/(In + Al + Y + Sn): wt % (at %) | 2.0 wt % (5.3 at %) | 8.0 wt % (19.1 at %) |
| | Y/(In + Al + Y + Sn): wt % (at %) | 0.0 wt % (0.0 at %) | 0.0 wt % (0.0 at %) |
| | Sn/(In + Al + Y + Sn): wt % (at %) | 0.0 wt % (0.0 at %) | 0.0 wt % (0.0 at %) |
| Film forming conditions of semiconductor film | Atmospheric gas | Ar + O$_2$ + H$_2$O | Ar + O$_2$ + H$_2$ |
| | Back pressure before film formation (Pa) | 5.E−04 | 5.E−04 |
| | Sputtering pressrue (Pa) at the time of film formation | 0.5 | 0.5 |
| | Substrate temperature at the time of film formation (° C.) | 200° C. | Room temperature |
| | Oxygen partial pressure at the time of film formation (%) | 10 | 10 |
| | Water partial pressure at the time of film formation (%) | 5 | — |
| | Hydrogen partial pressure at the time of fim formation (%) | — | 5 |
| Heat treatment conditions after forming semiconductor film | Heat treatment after film formation: Temperature (° C.) | 300 | 350 |
| | : Temperature elevation speed (° C./min) | Input to a 300° C. furnace | Input to a 350° C. furnace |
| | : Time(min) | 60 | 60 |
| | : Atmosphere | Air | Air |
| Thin film properties of semiconductor film | Film thickness (nm) | 50 | 50 |
| | Hall measurement carrier density (cm⁻³) | 4.4E+14 | 1.9E+13 |
| | Hall measurement mobility (cm²/V · sec) | 11.0 | 5.8 |
| | Crystallinity immediately after deposition (XRD) | Fine crystals | Amorphous |
| | Crystallinity immediately after heating (XRD) | Crystals | Fine crystals |
| | Average crystal grain size (grain size: μm) immediately after heating by crystallinity (EBSD) | Radial 3 μm or more | Fine crystals 1 μm or less |

TABLE 1-3-continued

|  |  | Comp. Ex. 1 | Comp. Ex. 2 |
|---|---|---|---|
| Properties of semiconductor layer after formation of SiO$_2$ film by CVD at a substrate temperature of 350° C. | Ratio of area occupied by faceted crystals (%) | <30% | — |
|  | Band gap (eV) of thin film | 3.6 | 3.5 |
|  | Hall measuremnt carrier density (cm$^{-3}$) | 5.9E+19 | 8.3E+19 |
|  | Hall measuremnt mobility (cm$^2$/V · sec) | 8.2 | 16.5 |
| Properties after heat treatment after formation of SiO$_2$ film by CVD | Heat treatment: Temperature (° C.) | 300 | 350 |
|  | : Time (min) | 60 | 60 |
|  | : Atmosphere | Air | Air |
|  | Hall measurement carrier density (cm$^{-3}$) | 3.6E+16 | 5.4E+15 |
|  | Hall measurement mobility (cm$^2$/V · sec) | 6.6 | 9.5 |
| TFT properties | Saturation mobility (cm$^2$/V · sec) | 16.2 | 12.5 |
|  | Vth(V) | >2.4 | >01 |
|  | On/off ratio | >E+6 | >E+6 |
|  | Off current (A) | <E−10 | <E−10 |
| High-speed response TFT properties | Mobility at Vth + 5 V in linear region (cm$^2$/V · sec) | 3.2 | 2.8 |
|  | Average mobility ratio relative to maximum mobility (%) | 43 | 46 |

Examples 10 and 11

Thin film transistors were produced in the same manner as in Example 1, except that semiconductor thin films were formed by using the sputtering targets having compositions shown in Table 2 and a heat treatment or the like were conducted, and properties of a TFT were evaluated.

Further, in the same manner as in Example 1, for a sample on which only an oxide thin film was mounted on a glass substrate, hall measurements were conducted at each stage in Table 2. An increase or decrease in carrier density and band gap were measured, and the results are shown in Table 2.

In the atomic ratio of the sputtering targets shown in the table, the numerical value shown by the "wt %" indicates the weight ratio (charged amount) of indium oxide, gallium oxide, yttrium oxide and tin oxide, the numerical value indicated by the "at %" indicates an indium element, a gallium element, an yttrium element and a tin element.

The "E+XX" in the table means "1×10$^{+XX}$".

The "ratio of the average mobility ratio (%) relative to the maximum mobility" in the table means the ratio (%) of the average mobility in this range relative to the maximum mobility in the range of Vg=Vth to Vth+20.

TABLE 2

|  |  | Ex. 10 | Ex. 11 |
|---|---|---|---|
| Atomic ratio of sputtering target | In/(In + Ga + Y + Sn): wt % (at %) | 92.4 wt % (89.7 at %) | 93.0 wt % (90.0 at %) |
|  | Ga/(In + Ga + Y + Sn): wt % (at %) | 5.0 wt % (7.2 at %) | 7.0 wt % (10.0 at %) |
|  | Y/(In + Ga + Y + Sn): wt % (at %) | 2.6 wt % (3.1 at %) | 0.0 wt % (0.0 at %) |
|  | Sn/(In + Ga + Y + Sn): wt % (at %) | 0.0 wt % (0.0 at %) | 0.0 wt % (0.0 at %) |
| Film forming conditions of semiconductor film | Atmosphere gas | Ar + O$_2$ | Ar + O$_2$ |
|  | Back pressure before film formation (Pa) | 5.E−04 | 5.E−04 |
|  | Sputtering pressure at the time of film formation (Pa) | 0.5 | 0.5 |
|  | Substrate temperature at the time of film formation (° C.) | Room temperature | Room temperature |
|  | Oxygen partial pressure at the time of film formation (%) | 20 | 20 |
|  | Water partial pressrue at the time of film formation (%) | — | — |
|  | Hydrogen partial pressuure at the time of film formation (%) | — | — |
| Heat treatment conditions after formation of semiconductor film | Heat treatment after film formation: tempreture (° C.) | 300 | 350 |
|  | : Temperature-elevating speed (° C./min) | 10 | 10 |
|  | : Time (min) | 120 | 120 |
|  | : Atmosphere | Air | Air |
| Thin film properties of semiconductor film | Film thickness (nm) | 50 | 50 |
|  | Hall measuremnt carrier density (cm$^{-3}$) | 2.8E+16 | 1.2E+17 |
|  | Hall measuremnt mobilty (cm$^2$/V · sec) | 7.1 | 19.5 |
|  | Crystallinity immdiately after deposition (XRD) | Amorphous | Amorphous |
|  | Crystallinity immediately after heating (XRD) | Crystal: Bixbyite structure | Crystal: Bixbyite structure |
|  | Average crystal grain size by crystallinity immediately after heating (EBSD) (grain size: μm) | Facet 1 μm or more | Facet 2 μm or more |
|  | Ratio (%) occupied by faceted crystals | >95% | >95% |
|  | Band gap of thin film (eV) | 3.7 | 3.7 |
| Properties of semiconductor layer after formation of SiO$_2$ film by CVD at a substrate temperature of 350° C. | Hall measurement carrier density (cm$^{-3}$) | 2.8E+19 | 4.2E+19 |
|  | Hall measuremnt mobility (cm$^2$/V · sec) | 46.7 | 49.2 |
| Propereties after heat treatment after formation of SiO$_2$ film by CVD | Heat treatment: Temperature (° C.) | 350 | 350 |
|  | : Time (min) | 60 | 60 |
|  | : Atmosphre | Air | Air |
|  | Hall measurement carrier density (cm$^{-3}$) | 1.9E+17 | 1.5E+18 |
|  | Hall measuremnt mobility (cm$^2$/V · sec) | 17.7 | 31.6 |
| TFT properties | Saturation mobility (cm$^2$/V · sec) | 43.1 | 38.1 |
|  | Vth (V) | −0.8 | −1.7 |

TABLE 2-continued

|  |  | Ex. 10 | Ex. 11 |
|---|---|---|---|
| | On/off ratio | >E+8 | >E+8 |
| | Off current (A) | <E−12 | <E−12 |
| High-speed response TFT properties | Mobility at Vth + 5 V in linear region (cm$^2$/V · sec) | 13.4 | 18.6 |
| | Average mobility ratio (%) relative to maximum mobility | 59 | 58 |

Examples 12 and 13

Thin film transistors were produced in the same manner as in Example 1, except that semiconductor thin films were formed by using sputtering targets having the compositions shown in Table 3 and a heat treatment or the like were conducted, and properties of a TFT were evaluated.

In the same manner as in Example 1, for a sample on which only an oxide thin film was mounted on a glass substrate, hall measurement was conducted at each stage shown in Table 3, and an increase or decrease of carrier density and band gap were measured. The results are shown in Table 3.

In the atomic ratio of the sputtering target in the table, the numerical value indicated by "wt %" shows the weight ratio (charged amount) of indium oxide, gallium oxide, samarium oxide and tin oxide, and the numerical value indicated by "at %" shows the atomic value of an indium element, a gallium element, a samarium element and a tin element.

The "E+XX" in the table means "1×10$^{+XX}$".

The "ratio of the average mobility ratio (%) relative to the maximum mobility" in the table means the ratio (%) of the average mobility in this range relative to the maximum mobility in the range of Vg=from Vth to Vg=Vth+20.

TABLE 3

|  |  | Ex. 12 | Ex. 13 |
|---|---|---|---|
| Atomic ratio of sputtering target | In/(In + Ga + Sm + Sn): wt % (at %) | 87.0 wt % (89.4 at %) | 90.0 wt % (88.8 at %) |
| | Ga/(In + Ga + Sm + Sn): wt % (at %) | 0.0 wt % (0.0 at %) | 5.0 wt % (7.3 at %) |
| | Sm/(In + Ga + Sm + Sn): wt % (at %) | 13.0 wt % (10.6 at %) | 5.0 wt % (3.9 at %) |
| | Sn/(In + Ga + Sm + Sn): wt % (at %) | 0.0 wt % (0.0 at %) | 0.0 wt % (0.0 at %) |
| Film forming conditions of semiconductor film | Atmospheric gas | Ar + O$_2$ | Ar + O$_2$ |
| | Back pressure before film formation (Pa) | 5.E−04 | 5.E−04 |
| | Sputtering pressure at the time of film formation (Pa) | 0.5 | 0.5 |
| | Substrate temperature at the time of film formation (° C.) | Room temperature | Room temperature |
| | Oxygen partial pressure at the time of film formation (%) | 20 | 20 |
| | Water pressure at the time of film formation (%) | — | — |
| | Hydrogen partial pressure at the time of film formation (%) | — | — |
| Heat treatment conditions after forming semiconductor thin film | Heat treatment after film formation: Temperature (° C.) | 300 | 300 |
| | : Temperature elevation speed (° C./min) | 10 | 10 |
| | : Time (min) | 120 | 120 |
| | : Atmosphere | Air | Air |
| Thin film properties of semiconductor film | Film thickness (nm) | 50 | 50 |
| | Hall measuremnt carrier density (cm$^{-3}$) | 9.7E+14 | 1.78E+15 |
| | Hall measurement mobility (cm$^2$/V · sec) | 14.1 | 7.22 |
| | Crystallinity immediately after deposition (XRD) | Amorphous | Amorphous |
| | Crystallinity immediately after heating (XRD) | Crystalline: Bixbyite structure | Crystal: Bixbyite structure |
| | Average crystal grain size immediately after heating by (EBSD) (grain size: μm) | Facet 1 μm or more | Facet 1 μm or more |
| | Ratio of area occupied by faceted crystals (%) | >90% | >90% |
| | Band gap of thin film (eV) | 3.8 | 3.8 |
| Properties of semiconductor layer after formaiton of SiO$_2$ film by CVD at a substrate temperature of 350° C. | Hall measurement carrier density (cm$^{-3}$) | 5.3E+18 | 1.1E+19 |
| | Hall measuremnt mobility (cm$^2$/V · sec) | 27.2 | 45.2 |
| Properties after heat treament after formation of SiO$_2$ film by CVD | Heat treatment: Temperature (° C.) | 350 | 350 |
| | : Time (min) | 60 | 60 |
| | : Atmosphere | Air | Air |
| | Hall measurement carrier density (cm$^{-3}$) | 2.0E+16 | 5.3E+16 |
| | Hall measuremnt mobility (cm$^2$/V · sec) | 18.4 | 22.7 |
| TFT properties | Saturation mobility (cm$^2$/V · sec) | 31.4 | 36.1 |
| | Vth(V) | −0.2 | −0.1 |
| | on/off ratio | >E+8 | >E+8 |
| | Off current (A) | <E−12 | <E−12 |
| High-speed response TFT properties | Mobility at Vth + 5 V in linear range (cm2/V · sec) | 14.2 | 12.1 |
| | Average ratio of mobility relative to maximum mobility (%) | 62 | 67 |

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. A crystalline oxide semiconductor thin film that is composed mainly of indium oxide, wherein
when an observation of the crystalline oxide semiconductor thin film is made by means of an electron backscatter diffraction, crystal grains of which a surface crystal state is faceted are observed, and the average crystal diameter of the faceted crystal grains is 2 or more and 10 μm or less.

2. The crystalline oxide semiconductor thin film according to claim 1, wherein the area occupied by the crystal grains of which the surface crystal state is faceted is 50% or more.

3. The crystalline oxide semiconductor thin film according to claim 1, which comprises one or more elements selected from the group consisting of positive trivalent metal elements other than an indium element.

4. The crystalline oxide semiconductor thin film according to claim 3, wherein the content of the positive trivalent metal element other than the indium element is larger than 8 at % to 17 at % or less relative to total metal contents in the crystalline oxide semiconductor thin film.

5. The crystalline oxide semiconductor thin film according to claim 3, wherein the positive trivalent metal element other than the indium element is one or two or more selected from the group consisting of aluminum, gallium, yttrium and a lanthanoid-based element.

6. The crystalline oxide semiconductor thin film according to claim 1 which comprises one or more elements selected from the group consisting of positive tetravalent metal elements.

7. The crystalline oxide semiconductor thin film according to claim 6, wherein the content of the positive tetravalent metal element is 0.01 at % or more to 1 at % or less relative to the total metal content in the crystalline oxide semiconductor thin film.

8. The crystalline oxide semiconductor thin film according to claim 6, wherein the positive tetravalent metal element is one or more selected from the group consisting of tin, zirconium and cerium.

9. The crystalline oxide semiconductor thin film according to claim 1 which has a band gap of 3.6 eV or more.

10. A method for producing the crystalline oxide semiconductor thin film according to claim 1, comprising:

forming an oxide thin film by sputtering by using a sputtering target composed mainly of indium oxide and by using as a sputtering gas a mixed gas of argon and oxygen that substantially comprises no impurity gas; and heating the obtained oxide thin film.

11. The method for producing the crystalline oxide semiconductor thin film according to claim 10, wherein the amount ratio of the impurity gas in the sputtering gas is 0.1 vol % or less.

12. The method for producing the crystalline oxide semiconductor thin film according to claim 10, wherein the sputtering target comprises one or more elements selected from the group consisting of aluminum, gallium, yttrium and a lanthanoid-based element.

13. The method for producing the crystalline oxide semiconductor thin film according to claim 10, wherein the heating temperature is 250° C. or higher to 500° C. or lower.

14. The method for producing the crystalline oxide semiconductor thin film according to claim 10, wherein, in the step of heating, a temperature-elevation speed is 20° C./min or less in a temperature range of from 150° C. to 250° C.

15. The method for producing the crystalline oxide semiconductor thin film according to claim 10, wherein the heating time is 0.1 hour or longer to 5 hours or shorter.

16. A thin film transistor comprising a source electrode and a drain electrode, a gate electrode, a gate insulating film, a protective insulating film and an oxide semiconductor layer, wherein the oxide semiconductor layer is positioned between the gate insulating film and the protective insulating film and is formed of the crystalline oxide semiconductor thin film according to claim 1.

17. The thin film transistor according to claim 16 that has a saturation mobility of 30 cm$^2$/V·sec or more.

18. The thin film transistor according to claim 16, wherein, at a drain voltage of 0.1V, from a Vg-μ curve obtained by a method for measuring a field effect mobility in a linear region, the mobility at Vg=Vth+5 is 10 cm$^2$/Vs or more and the average mobility from Vg=Vth to Vg=Vth+20 is 50% or more relative to the maximum mobility in this range.

19. An electric device or a vehicle that uses the thin film transistor according to claim 16.

* * * * *

UNITED STATES PATENT AND TRADEMARK OFFICE
CERTIFICATE OF CORRECTION

PATENT NO. : 10,636,914 B2  
APPLICATION NO. : 15/748356  
DATED : April 28, 2020  
INVENTOR(S) : Kazuyoshi Inoue et al.

Page 1 of 1

It is certified that error appears in the above-identified patent and that said Letters Patent is hereby corrected as shown below:

In the Claims

Claim 1, Column 25, Line 20:  
Please delete:  
diameter of the faceted crystal grains is 2 or more and  
Please replace with:  
diameter of the faceted crystal grains is 2 μm or more and Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*